United States Patent
Shibata et al.

(10) Patent No.: US 8,097,511 B2
(45) Date of Patent: Jan. 17, 2012

(54) SEMICONDUCTOR DEVICE HAVING P-N COLUMN LAYER AND METHOD FOR MANUFACTURING THE SAME

(75) Inventors: Takumi Shibata, Kariya (JP); Shouichi Yamauchi, Nagoya (JP); Syouji Nogami, Tokyo (JP); Tomonori Yamaoka, Tokyo (JP)

(73) Assignees: Denso Corporation, Kariya (JP); Sumco Corporation, Tokyo (JP)

( * ) Notice: Subject to any disclaimer, the term of this patent is extended or adjusted under 35 U.S.C. 154(b) by 413 days.

(21) Appl. No.: 12/155,485

(22) Filed: Jun. 5, 2008

(65) Prior Publication Data

US 2008/0303114 A1 Dec. 11, 2008

(30) Foreign Application Priority Data

Jun. 6, 2007 (JP) ................................ 2007-150889

(51) Int. Cl.
*H01L 21/336* (2006.01)
(52) U.S. Cl. ........ 438/270; 438/197; 438/689; 257/288; 257/135; 257/220
(58) Field of Classification Search .................. None
See application file for complete search history.

(56) References Cited

U.S. PATENT DOCUMENTS

| | | | |
|---|---|---|---|
| 5,216,275 A | 6/1993 | Chen | |
| 5,438,215 A | 8/1995 | Tihanyi | |
| 5,868,948 A * | 2/1999 | Fujii et al. .......................... | 216/2 |
| 6,097,063 A | 8/2000 | Fujihira | |
| 6,294,818 B1 | 9/2001 | Fujihira | |
| 6,495,294 B1 * | 12/2002 | Yamauchi et al. ............ | 438/597 |
| 6,566,709 B2 | 5/2003 | Fujihira | |
| 6,621,132 B2 * | 9/2003 | Onishi et al. .................. | 257/409 |
| 6,627,948 B1 | 9/2003 | Fujihira | |
| 6,700,157 B2 | 3/2004 | Fujihira | |
| 6,720,615 B2 | 4/2004 | Fujihira | |
| 6,724,040 B2 | 4/2004 | Fujihira | |
| 6,734,496 B2 | 5/2004 | Fujihira | |
| 6,888,195 B2 * | 5/2005 | Saito et al. ..................... | 257/328 |
| 7,029,977 B2 | 4/2006 | Kishimoto et al. | |
| 7,262,459 B2 * | 8/2007 | Takahashi et al. ............. | 257/328 |
| RE41,181 E * | 3/2010 | Takeda et al. .................. | 438/514 |
| 2003/0190789 A1 * | 10/2003 | Salama et al. ................. | 438/286 |

(Continued)

OTHER PUBLICATIONS

Hardikar et al. "A local charge control technique to improve the forward bias safe operating area of LIGBT", Solid-State Electronics 44 (2000) 1213-1218.*

(Continued)

*Primary Examiner* — N Drew Richards
*Assistant Examiner* — Peter Bradford
(74) *Attorney, Agent, or Firm* — Posz Law Group, PLC (57) ABSTRACT

A semiconductor device is provided, which includes a substrate; a P-N column layer disposed on the substrate; a second conductivity type epitaxial layer disposed on the P-N column layer. The P-N column layer includes first conductivity type columns and second conductivity type columns, which are alternately arranged. Each column has a tapered shape. A portion of the first conductivity type column located around the substrate has a smaller impurity concentration than another portion of the first conductivity type column located around the second conductivity type epitaxial layer. A portion of the second conductivity type column located around the substrate has a larger impurity concentration than another portion of the first conductivity type column located around the second conductivity type epitaxial layer.

22 Claims, 6 Drawing Sheets

U.S. PATENT DOCUMENTS

| | | | |
|---|---|---|---|
| 2004/0063288 A1* | 4/2004 | Kenney et al. | 438/301 |
| 2004/0185665 A1* | 9/2004 | Kishimoto et al. | 438/689 |
| 2005/0017300 A1* | 1/2005 | Salama et al. | 257/342 |
| 2005/0026382 A1* | 2/2005 | Akatsu et al. | 438/386 |
| 2005/0221547 A1* | 10/2005 | Yamauchi et al. | 438/172 |
| 2006/0138407 A1* | 6/2006 | Yamaguchi et al. | 257/40 |
| 2006/0172489 A1* | 8/2006 | Seidl et al. | 438/253 |
| 2007/0015333 A1* | 1/2007 | Kishimoto et al. | 438/259 |
| 2007/0052066 A1* | 3/2007 | Beasom | 257/565 |
| 2007/0072398 A1 | 3/2007 | Shibata et al. | |
| 2007/0096237 A1* | 5/2007 | Zhao et al. | 257/438 |
| 2007/0108444 A1* | 5/2007 | Nogami et al. | 257/51 |
| 2007/0138548 A1* | 6/2007 | Kocon et al. | 257/336 |
| 2008/0001261 A1 | 1/2008 | Nogami et al. | |
| 2010/0117188 A1* | 5/2010 | Waldrab et al. | 257/506 |

OTHER PUBLICATIONS

Shenoy, "Analysis of the Effect of Charge Imbalance on the Static and Dynamic Characteristics of the Super Junction Mosfet", Proceedings of the 11th International Symposium on Power Semiconductor Devices and ICs, pp. 99-102, 1999; Kocon, 2007/0138548.*

Office Action dated Oct. 30, 2009 from the German Patent and Trademark Office in corresponding patent application No. 10 2008 026 561.0-33 (English translation enclosed).

* cited by examiner

BREAKDOWN VOLTAGE : 151 [V]

FIG. 5B

BREAKDOWN VOLTAGE : 279 [V]

SEMICONDUCTOR DEVICE HAVING P-N COLUMN LAYER AND METHOD FOR MANUFACTURING THE SAME

CROSS REFERENCE TO RELATED APPLICATION

The present application is based on Japanese Patent Application No. 2007-150889 filed on Jun. 6, 2007, the disclosure of which is incorporated herein by reference.

BACKGROUND OF THE INVENTION

1. Field of the Invention

The present invention relates to a semiconductor device including a P-N column layer and a method for manufacturing the same.

2. Description of Related Art

Recently, in a field of power semiconductor device, a vertical type super junction semiconductor device (referred also to herein as SJ-MOS) has been known as a semiconductor device that may be capable of having both a high breakdown voltage and a low on-state resistance. The SJ-MOS includes a P-N column layer, which functions as a super junction (SJ) and provides a drift layer. An SJ-MOS like the above devices is disclosed in, for example, Japanese Unexamined Patent Application Publication Number 2002-76339 corresponding to U.S. Pat. No. 6,621,132.

Japanese Patent Number 3485081 (corresponding to U.S. Pat. No. 6,495,294) and Japanese Unexamined Patent Application Publication Number 2004-273742 (corresponding to U.S. Pat. No. 7,029,977) show a method for manufacturing a P-N column layer like the above P-N column layer, the method including: forming multiple trenches in an N conductivity type epitaxial layer; and forming a trench filling epitaxial layer having a P conductivity type in each trench. According to the above method, the trench filling epitaxial layer is formed, for example, through an anisotropic growth from a bottom of each trench by Low Pressure Chemical Vapor Deposition (LP-CVD) under a condition of simultaneously flowing silicon source gas (e.g., $SiH_2Cl_2$) and halide gas (e.g., HCl). The halide gas functions as etching gas.

The above manufacturing method, however, may be difficult to stably provide a semiconductor device including a P-N column layer having columns with high aspect ratios.

SUMMARY OF THE INVENTION

In view of the above-described difficulty, it is an object of the present invention to provide a semiconductor device including a P-N column layer, which functions as a super junction and which has columns with high aspect ratios, and a method for manufacturing a semiconductor device.

According to a first aspect of the present invention, a semiconductor device is provided. The semiconductor device includes: a substrate having a first conductivity type and having a first side; a P-N column layer disposed on the first side of the substrate and provided by an epitaxial layer made of silicon; a second conductivity type epitaxial layer disposed on the P-N column layer and made of silicon. The P-N column layer includes a plurality of first conductivity type columns and a plurality of second conductivity type columns, which are alternately arranged and in contact with each other. Each of the plurality of first and second conductivity type columns has a substantially rectangular box shape and a substantially same thickness along direction perpendicular to the first side of the substrate. Each first conductivity type column has a first cross section taken along a first plane parallel to the first side of the substrate, the first cross section having a substantially rectangular shape. Each second conductivity type column has a second cross section taken along the first plane, the second cross section having a substantially rectangular shape. Each first conductivity type column has a third cross section taken along a second plane, which is perpendicular to a contact surface between the first and second conductivity type columns and perpendicular to the first side of the substrate. The third cross section of each first conductivity type column has a tapered shape such that a portion of the first conductivity type column located around the substrate is wider than another portion of the first conductivity type column located around the second conductivity type epitaxial layer. The second conductivity type column has a fourth cross section taken along the second plane. The fourth cross section of each second conductivity type column has a tapered shape such that that a portion of the second conductivity type column located around the substrate is narrower than another portion of the second conductivity type column located around the second conductivity type epitaxial layer. Each first conductivity type column has a first impurity concentration distribution therein such that a portion of the first conductivity type column located around the substrate has a smaller impurity concentration than another portion of the first conductivity type column located around the second conductivity type epitaxial layer. Each second conductivity type column has a second impurity concentration distribution therein such that a portion of the second conductivity type column located around the substrate has a larger impurity concentration than another portion of the second conductivity type column located around the second conductivity type epitaxial layer.

According to the above semiconductor device, the semiconductor device includes the P-N column layer, which functions as a super junction. The P-N column has columns with high aspect ratios. The semiconductor device has both a high breakdown voltage and a low on-state resistance.

According to a second aspect of the present invention, a method for manufacturing a semiconductor device is provided. The method includes: forming a P-N column layer on a first side of silicon substrate having a first conductivity type, wherein the P-N column layer includes a plurality of a first conductivity type columns and a plurality of second conductivity type columns, which are alternately arranged and in contact with each other, wherein each of the plurality of first and second conductivity type columns has a substantially rectangular box shape and a same thickness along a direction perpendicular to the first side of the substrate. The forming the P-N column layer includes: forming a first conductivity type epitaxial layer made of silicon on the first side of the substrate so that a first portion of the first conductivity type epitaxial layer has a smaller impurity concentration than a second portion of the first conductivity type epitaxial layer, wherein the second portion of the first conductivity type epitaxial layer is located more distant from the first side of the substrate than the first portion of the first conductivity type epitaxial layer. The forming the P-N column layer further includes: forming a plurality of trenches in the first conductivity epitaxial layer, wherein each trench has a substantially rectangular box shape, wherein the plurality of trenches is arranged at regular intervals, wherein each trench has a first cross section taken along a first plane parallel to the first side of the substrate and a second cross section taken along a second plane perpendicular to the first side of the substrate, and wherein the first cross section of each trench has a substantially rectangular shape, and wherein the second cross section of each trench has a tapered shape such that a distance between side-walls of the trench increases with increasing distance from the first side of the substrate. The forming the P-N column layer further includes: forming a plurality of trench filling epitaxial layers to fill the plurality of trenches, wherein each trench filling epitaxial layer has a second conductivity type, wherein each trench filling epitaxial layer in each trench has an impurity concentration distribution therein such that a third portion of the trench filling epitaxial layer has a larger impurity concentration than a fourth portion of the trench filling epitaxial layer, and wherein the fourth portion of the trench filling epitaxial layer is located more distant from the first side of the substrate than the third portion of the trench filling epitaxial layer, wherein the first conductivity type epitaxial layer provides the plurality of first conductivity type epitaxial columns, and wherein the plurality of trench filling epitaxial layers provides the plurality of second conductivity type columns. The method further includes: forming a second conductivity type epitaxial layer made of silicon on the P-N column layer.

According to the above method, a semiconductor device is capable of being provided. The semiconductor device includes the P-N column layer, which functions as a super junction. It is possible to form the P-N column having columns with high aspect ratios and less crystal defects. It is possible to form the semiconductor device having both a high breakdown voltage and a low on-state resistance.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

An SJ-MOS 100 according to a related art is described below with reference to FIG. 8.

The SJ-MOS 100 is an N-channel SJ-MOS and includes a silicon substrate 1, a P-N column layer 10, a P conductivity type epitaxial layer 3, an N conductivity type region 4, a P conductivity type region 3a, and a trench insulation gate electrode 20. The silicon substrate 1 has an N conductivity type (more specifically, N+ conductivity type) and provides a drain region. The P-N column layer 10 is disposed on the silicon substrate 1 and provided by epitaxial layers. The P-N column layer 10 includes multiple N conductivity type columns 2n and multiple P conductivity type columns 2p, which are alternately arranged and which are in contact with each other. Each of the multiple N conductivity type columns 2n and the multiple P conductivity type columns 2p have a rectangular box shape and a same thickness. The P conductivity type epitaxial layer 3 is disposed on the P-N column layer 10, is provided by an epitaxial layer made of silicon, and provides a channel formation layer. The N conductivity type region 4 is disposed in a surface portion of the P conductivity type epitaxial layer 3, has the N+ conductivity type, and provides a source region. The P conductivity type region 3a is disposed adjacent to the N conductivity type region 4 and has a common connection with the N conductivity type region 4. The P conductivity type region 3a provides an ohmic connection region for fixing an electric potential of the P conductivity type epitaxial layer 3. The trench insulation gate electrode 20 has a rectangular box shape and is disposed adjacent to the N conductivity type region 4 so as to penetrate through the P conductivity type epitaxial layer 3. The trench insulation gate electrode 20 includes a side wall insulation layer 5 and a trench filling polycrystalline silicon 6.

Figure 8:
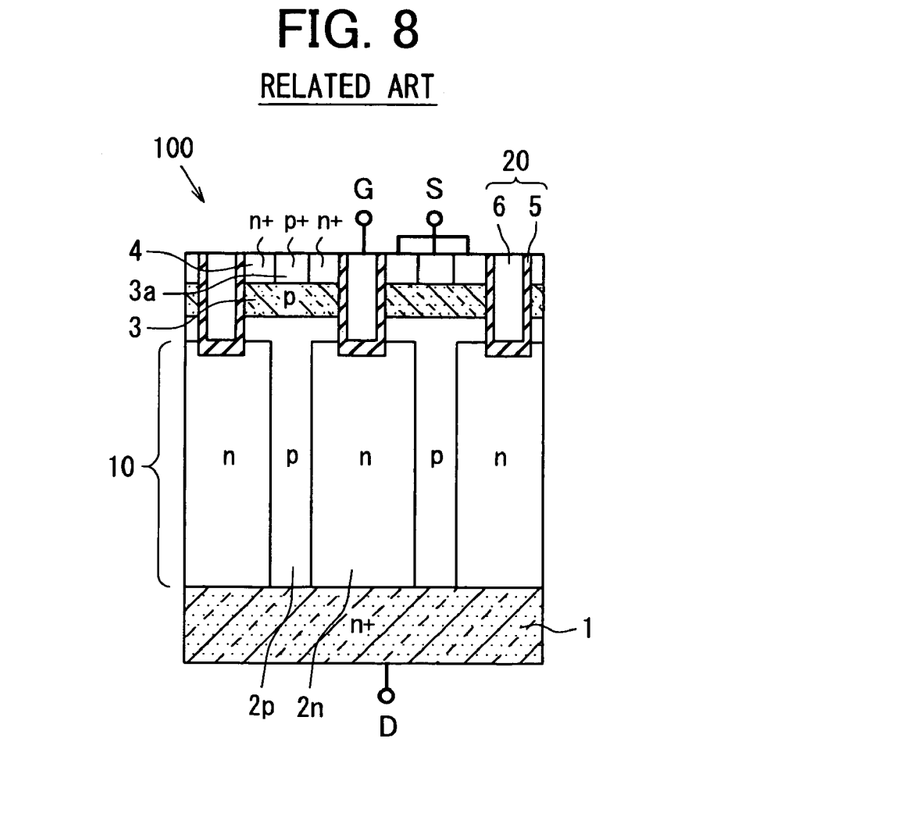
FIG. 8 is a diagram illustrating a cross sectional view of an SJ-MOS 100 in accordance with the related art.

In the SJ-MOS 100 shown in FIG. 8, the P-N column layer 10, the trench insulation gate electrode 20 and the source region 4 are arranged in parallel to a surface of the silicon substrate 1. Alternatively, the P-N column layer 10 may be arranged orthogonal to the trench insulation gate electrode 20 and the source region 4 with respect to the surface of the silicon substrate 1. Alternatively, the P-N column layer 10 may be arranged so as to be obliquely intersected with the trench insulation gate electrode 20 and the source region 4 with respect to the surface of the silicon substrate 1. When an conductivity type of each element of the SJ-MOS 100 shown in FIG. 8 is replaced with an opposite conductivity type, a P channel SJ-MOS 100 is provided.

The SJ-MOS 100 may be characterized by the P-N-column layer 10 having the multiple N conductivity type columns 2n and the multiple P conductivity type columns 2p, which are in contact with each other and which are alternately arranged. When each column 2n, 2p of the P-N column layer 10 has a high aspect ratio, such an SJ-MOS may have a low on-state resistance and a high breakdown voltage. However, when the column 2p of the P-N column layer 10 is fabricated by a trench filling epitaxial method, voids may be generated in this column 2p. In view of the above related art, a semiconductor device is presented below, the device including a P-N column layer which functions as a super junction and which has columns with high aspect ratios. Also, a method for a manufacturing the same is presented below.

Example Embodiment

A vertical type super junction semiconductor device (SJ-MOS) 110 according to an example embodiment is described below with reference to FIGS. 1 to 5B. The SJ-MOS 110 includes a P-N column layer 30, which function as a super junction.

Figure 1:
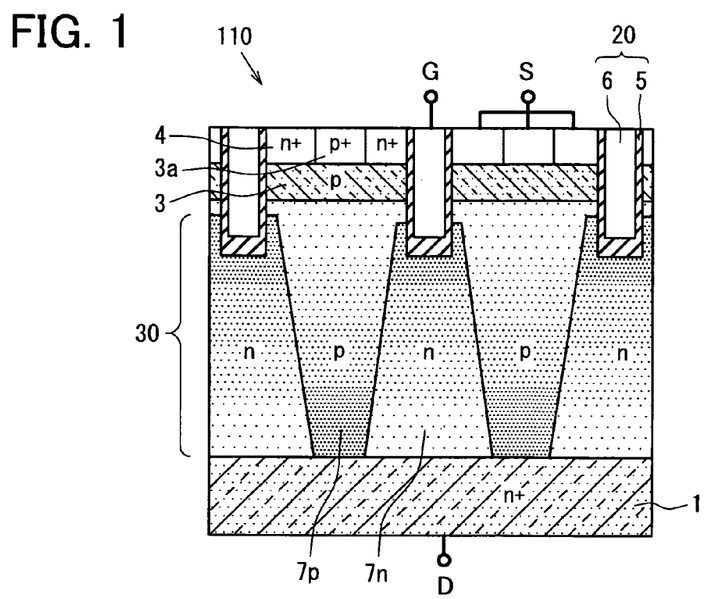
FIG. 1 is a diagram illustrating a cross sectional view of a semiconductor device 110 in accordance with an example embodiment.

FIG. 1 is a diagram schematically illustrating a cross sectional view of the semiconductor device (SJ-MOS) 110.

The SJ-MOS 110 is an N channel SJ-MOS and includes a silicon substrate 1, a P-N column layer 30, a P conductivity type epitaxial layer 3, an N conductivity type region 4, a P conductivity type region 3a, and a trench insulation gate electrode 20. The silicon substrate 1 has an N conductivity type, more specifically, N+ conductivity type, and provides a drain region. The P-N column layer 30 is disposed on the silicon substrate 1 and provided by an epitaxial layer made of silicon. The P-N column layer 30 includes multiple N conductivity type columns 7n and multiple P conductivity type columns 7p, which are in contact with each other and alternately arranged. Each of the N conductivity type column 7n and the P conductivity type column 7p has a substantially rectangular box shape. The P conductivity type epitaxial layer 3 is disposed on the P-N column layer 30, provided by an epitaxial layer made of silicon, and provides a channel formation layer. The N conductivity type region 4 is disposed in a surface portion of the P conductivity type epitaxial layer 3. The N conductivity type region 4 has an N+ conductivity type and provides a source region. The P conductivity type region 3a is disposed adjacent to the N conductivity type region 4, has common connection with the N conductivity type region 4, and has a P+ conductivity type. The P conductivity type region 3a provides an ohmic connection region for fixing an electric potential of the P conductivity type epitaxial layer 3. The trench insulation gate electrode 20 has a substantially rectangular box shape and is disposed adjacent to the N conductivity type region 4 so as to penetrate through the P conductivity type epitaxial layer 3. The trench insulation gate electrode 20 includes a side wall insulation layer 5 and a trench filling polycrystalline silicon 6. When a conductivity type of each element of the SJ-MOS 110 shown in FIG. 1 is changed into an opposite conductivity type, a P channel SJ-MOS is provided.

The SJ-MOS 110 may be characterized by the P-N-column layer 30 having the multiple N conductivity type columns 7n and the multiple P conductivity type columns 7p, which are connected with each other and which are alternately arranged. A cross sectional view of the N conductivity type columns 7n and the P conductivity type columns 7p taken along a first plane parallel to a surface of the silicon substrate 1 has a substantially rectangular shape. As shown in FIG. 1, another cross sectional view of the N conductivity type columns 7n and the P conductivity type columns 7p taken along a second plane, which is perpendicular to a contact surface between the N conductivity type column 7n and the P conductivity type column 7p, has a substantially tapered shape, which is different from the rectangular shape of a cross sectional view of the columns 2p, 2n shown in FIG. 8. Referring to a tapered shape shown in FIG. 1, a portion of each N conductivity type column 7n located around the silicon substrate 1 has a large width and another portion of each N conductivity type column 7n located around the P conductivity type epitaxial layer 3 has a small width.

Impurity concentration distribution in each N conductivity type column 7n is set in such a manner that the portion of the N conductivity type column 7n located around the silicon substrate 1 has a low impurity concentration and the another portion of the N conductivity type column 7n located around the P conductivity type epitaxial layer 3 has a high impurity concentration. Impurity concentration distribution in each P conductivity type column 7p is set in such a manner that a portion of the P conductivity type column 7p located around the silicon substrate 1 has a high impurity concentration and another portion of the P conductivity type column 7p located around the P conductivity type epitaxial layer 3 has a low impurity concentration. In FIG. 1, dot density illustrated in the P-N column layer 30 schematically expresses the above-described impurity concentration distribution. High dot density in FIG. 1 indicates a high impurity concentration and a low dot density indicates a low impurity concentration.

Since the P-N column layer 30, which functions as a super junction, is formed in the SJ-MOS 110 shown in FIG. 1, the SJ-MOS 110 has both a high breakdown voltage and a low on-state resistance. The P-N column layer 30 in the SJ-MOS 110 includes the N conductivity type columns 7n and the P conductivity type columns 7p, which are in contact with each other and which are alternately arranged. The N conductivity type columns 7n and the P conductivity type columns 7p have a substantially rectangular box shape and a substantially same thickness. Specifically, the N conductivity type columns 7n has such a tapered shape that the portion of the N conductivity type column 7n located around the silicon substrate 1 is configured to be wide and the another portion of the N conductivity type column 7n located around the P conductivity type epitaxial layer 3 is configured to be narrow. The P conductivity type column 7p contacting the N conductivity type column 7n accordingly has a tapered shape. Specifically, the portion of the P conductivity type column 7p located to around the silicon substrate 1 is configured to be narrow and the another portion of the P conductivity type column 7p located around the P conductivity type epitaxial layer 3 is configured to be wide. The P-N column layer 30 having the above-described configuration may be reliably manufactured by employing a manufacturing method described below, the manufacturing method including: forming multiple trenches; and forming multiple trench filling epitaxial layers. The manufacturing method is capable of providing the P-N column layer having a high aspect ratio, less voids, and less crystal defects. The high aspect ratio provides the semiconductor device 110 with a lower on-state resistance and a higher breakdown voltage.

To increase a breakdown voltage of the semiconductor device 110 as large as possible, it may be preferable that a total impurity quantity in the P conductivity type column 7p is equal to that in the N conductivity type column 7n in any depth of the P-N column layer 30, where the depth may be measured along a direction perpendicular to the surface of the silicon substrate 1.

Figure 2A:
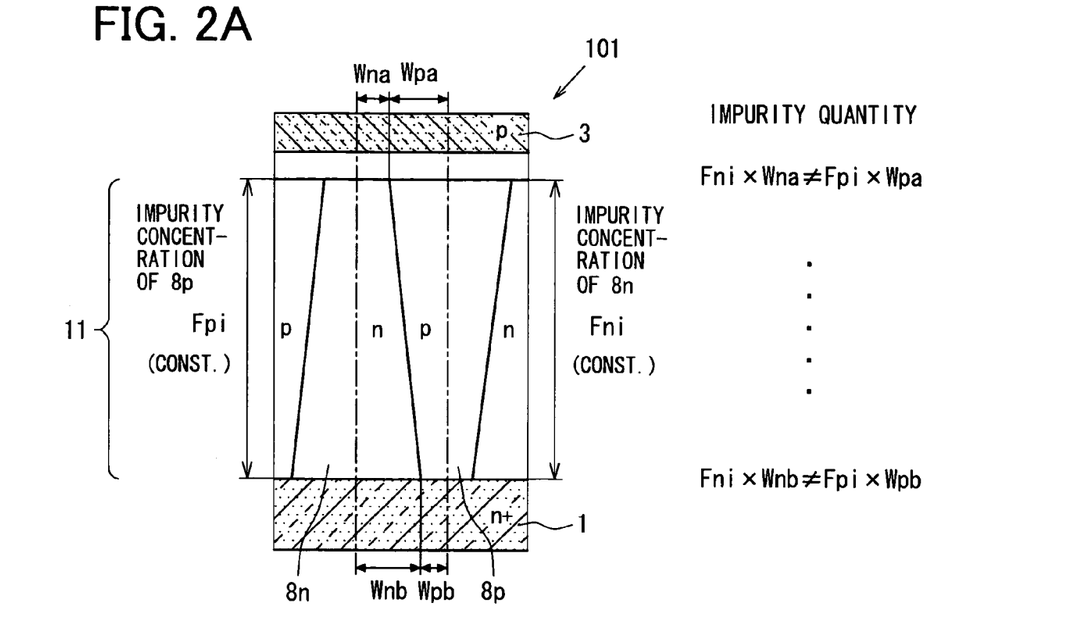
FIG. 2A is a diagram illustrating a cross sectional view of a portion of a semiconductor device 101.
Figure 2B:
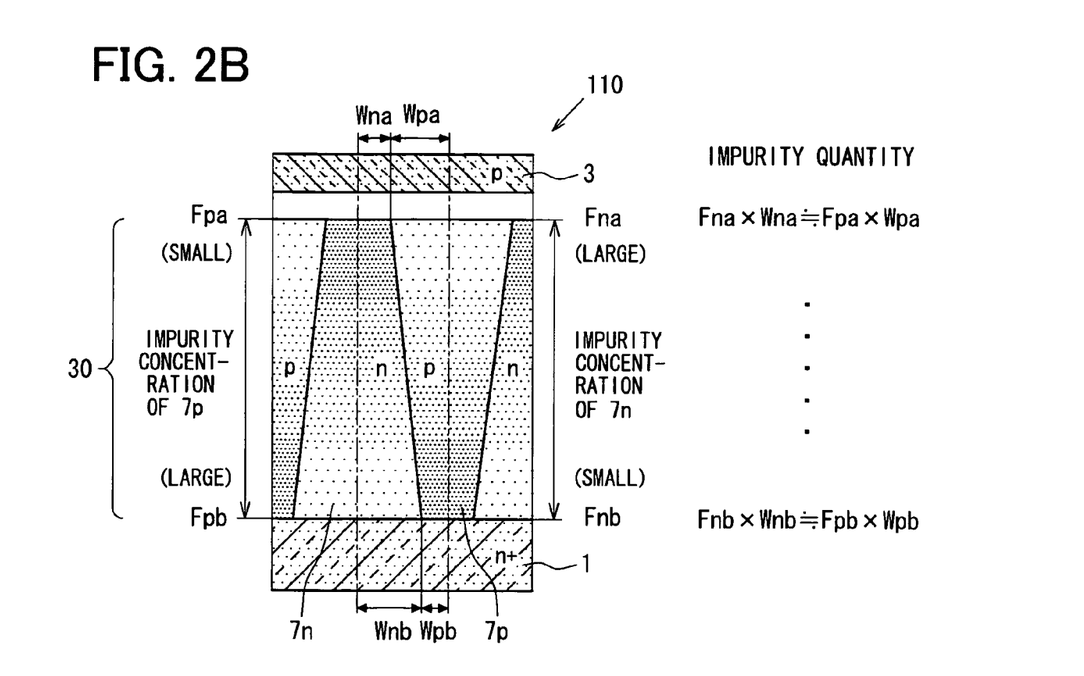
FIG. 2B is a diagram illustrating a cross sectional view a portion of the semiconductor device 110 shown in FIG. 1.

FIG. 2B is diagram illustrating a cross sectional view of the semiconductor device 110 and schematically illustrating variation of the impurity concentration in the P-N column layer 30. In the P-N column layer 30 illustrated in FIG. 2B, high dot density indicates a high impurity concentration and a low dot density indicates a low impurity concentration. For comparison, FIG. 2A is a diagram illustrating a semiconductor device 101 including a P-N column layer 11, in which an impurity concentration is substantially spatially constant in each column.

The semiconductor device 101 shown in FIG. 2A includes a P-N column layer 11, a cross sectional shape of which is substantially identical to that of the P-N column layer 30 of the semiconductor device 110 shown in FIG. 2B. Each of the N conductivity type columns 8n, 7n in the semiconductor device 101, 110 has a column width Wnb at a side thereof opposite to the silicon substrate 1 and a column width Wna at a side thereof opposite to the P conductivity type epitaxial layer 3. Each column width Wnb, Wna is defined as a distance, for example, between a dotted line and the corresponding contact region of the N conductivity type column with the P conductivity type column shown in FIGS. 2A and 2B. Also, each P conductivity type column 8p, 7p has a column width Wpb at the side thereof opposite to the silicon substrate 1 and a column width Wpa at the side thereof opposite to the P conductivity type epitaxial layer 3. Each column width Wpb, Wpa is defined as a distance, for example, between a dashed-dotted line and the corresponding contact region of the P conductivity type column with the N conductivity type column, as shown in FIGS. 2A and 2B.

In the semiconductor device 101 shown in FIG. 2A, an impurity concentration in the N conductivity type column 8n is substantially spatially constant at a predetermined constant value Fni in depth and impurity concentration in the P conductivity type column 8p is constant at a predetermined constant value Fpi in depth. In the semiconductor device 110 shown in FIG. 2B, impurity concentration distribution in the N conductivity type column 7n is set in such a manner that impurity concentration continuously increases from a concentration Fnb at the side thereof opposite to the silicon substrate 1 to a concentration Fna at the side thereof opposite to the P conductivity type epitaxial layer 3. Also, impurity concentration distribution in the P conductivity type column 7p is set in such a manner that impurity concentration continuously decreases from a concentration Fpb at the side thereof opposite to the silicon substrate 1 to a concentration Fpa at the side thereof opposite the P conductivity type epitaxial layer 3.

The columns of each P-N column layer 11, 30 of the semiconductor device 101, 110 have the tapered shape. As a result, in almost any depth, the column width of the N conductivity type column 8n, 7n is different from that of the P conductivity type column 8p, 7p. The above column width differences are not provided in the semiconductor device 100. Here, an impurity quantity of each of the N and P conductivity type columns 8n, 8p at a given depth is defined as the column width at the given depth multiplied by the impurity concentration at the given depth. The impurity quantity of the N conductivity type column 8n is different from that of the P conductivity type column 8p in almost any depth, as shown in the right-hand side of the FIG. 2A.

In the semiconductor device 110 shown in FIG. 2B, on the other hand, the impurity concentration of each column 7n, 7p at a given depth is set to be associated with the tapered shape, more specifically, inversely associated with the column width. More specifically, the impurity concentration distribution in the N conductivity type column 7n is set in such a manner that an impurity concentration of the N conductivity type column 7n at the side thereof opposite to the silicon substrate 1 is low and an impurity concentration of the N conductivity type column 7n at the side thereof opposite to the P conductivity type epitaxial layer 3 is high. Also, the impurity concentration distribution of the P conductivity type column 7p is set in such a manner that an impurity concentration in the P conductivity type column 7p at the side thereof opposite to the silicon substrate 1 is high and an impurity concentration of the P conductivity type column 7p at the side thereof opposite to the P conductivity type epitaxial layer 3 is low. Because of the above impurity concentration distribution, the difference of the impurity quantity between the N conductivity type column 7n and the P conductivity type column 7p in any given depth may be smaller than that between the N conductivity type column 8n and the P conductivity type column 8p. Therefore, as shown in the right-hand side of FIG. 2B, an impurity quantity of the N conductivity type column 7n is approximately equal to that of the P conductivity type column 7p in almost any depth, wherein the impurity quantity is calculated as the column width multiplied by the impurity concentration. Therefore, the semiconductor device 110 shown in FIG. 2B is possible to have a high breakdown voltage, which may be close to an ideal value.

Figure 3:
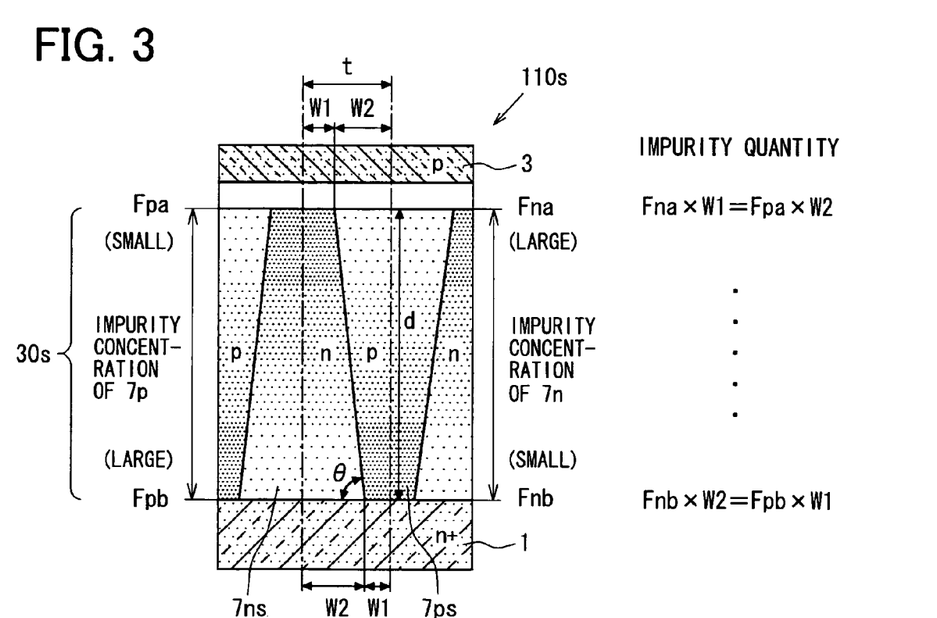
FIG. 3 is a diagram illustrating a cross sectional view of a semiconductor device 110s having an ideal P-N column layer 30.

FIG. 3 is a diagram schematically illustrating a cross sectional view of a semiconductor device 110s having a P-N column layer 30s with an idealized configuration. In FIG. 3, high dot density indicates a high impurity concentration and a low dot density indicates a low impurity concentration.

In the semiconductor device 110s shown in FIG. 3, an N conductivity type column 7ns defines a cross sectional view taken along the second plane. The cross sectional view of the N conductivity type column 7ns has a trapezoidal shape, un-paralleled two sides of which have an equal length. A P conductivity type column 7ps contacts the N conductivity type column 7ns and also defines a cross sectional view thereof taken along the second plane, the cross sectional view being a trapezoidal shape. The shape of the cross section of the P conductivity type column 7ps is identical to the vertically-inverted shape of the N conductivity type column 7ns. In other words, the shape of the cross section of the P conductivity type column 7ps and that of the N conductivity type column 7ns are congruent. Accordingly, a column width W1 of the N conductivity type column 7ns at a side thereof opposite to the P conductivity type epitaxial layer 3 is equal to that W1 of the P conductivity type column 7ps at a side thereof opposite to the silicon substrate 1. A column width W2 of the N conductivity type column 7ns at a side thereof opposite to the silicon substrate 1 is equal to that W2 of the P conductivity type column 7ps at a side thereof opposite to the P conductivity type epitaxial layer 3. The size of the trapezoidal shape of the N conductivity type column 7ns is the same of that of the P conductivity type column 7ps. Further, a pair of the N conductivity type column 7ns having the trapezoidal shape and the P conductivity type column 7ps having the inverted trapezoidal shape are alternately arranged in the P-N column layer 30. The P-N column layer 30 having the above configuration increases designing degree of freedom (i.e., designing flexibility) of the semiconductor device 110s.

In the semiconductor device 110s, as shown in the right-hand side of FIG. 3, the impurity quantity of the N conductivity type column 7ns is set to be equal to that of the P conductivity type column 7ps disposed adjacent to the N conductivity type column 7ns in any depth. To provide the above-described equal impurity quantity in any depth, the impurity concentration and a configuration of the P-N column layer is set in the following manners. The impurity concentration of the N conductivity type column is set to linearly increase from an impurity concentration Fnb at the side thereof opposite to the silicon substrate 1 to an impurity concentration Fna at the side thereof opposite to the P conductivity type epitaxial layer 3. The impurity concentration of the P conductivity type column is set to linearly decrease from an impurity concentration Fpb at the side thereof opposite to the silicon substrate 1 to an impurity concentration Fpa at the side thereof opposite to the P conductivity type epitaxial layer 3. The configuration and the impurity concentration are set to satisfy the following relations:

$$\frac{F_{pa}}{F_{nb}} = 1, \qquad \text{eq. (1)}$$

$$\frac{F_{na}}{F_{nb}} = \frac{\tan\theta + A}{\tan\theta - A}, \qquad \text{eq. (2)}$$

-continued $$\frac{F_{pb}}{F_{nb}} = \frac{\tan\theta + A}{\tan\theta - A},$$ eq. (3)

where θ is a taper angle, A=d/t is an aspect ratio, d is equal to W1+W2, and t is a thickness of each column 7ns, 7ps, as shown in FIG. 3. Because of the above configuration and the impurity concentration distribution, the semiconductor device 110s has a high breakdown voltage.

In the semiconductor device 110s, an impurity quantity of the N conductivity type column 7ns is set to be approximately equal to an impurity quantity of the P conductivity type column 7ps disposed adjacent to the N conductivity type column 7ns in almost any depth. In addition, a sum of an impurity quantity of the N conductivity type column 7ns and an impurity quantity of the P conductivity type column 7ps disposed adjacent to the N conductivity type column 7ns is constant. Therefore, as described below, in a case of depletion layer formation, a gradient of an electric potential field in the P-N column layer 30s is roughly spatially constant. In addition, it is possible to configure the semiconductor device 110s in such a manner that an aspect ratio A of each of the N conductivity type column 7ns and the P conductivity type column 7ps is greater than or equal to 1 and less than or equal to 100. A larger aspect ratio provides a semiconductor device with a lower on-state resistance and a higher breakdown voltage.

Figure 4:
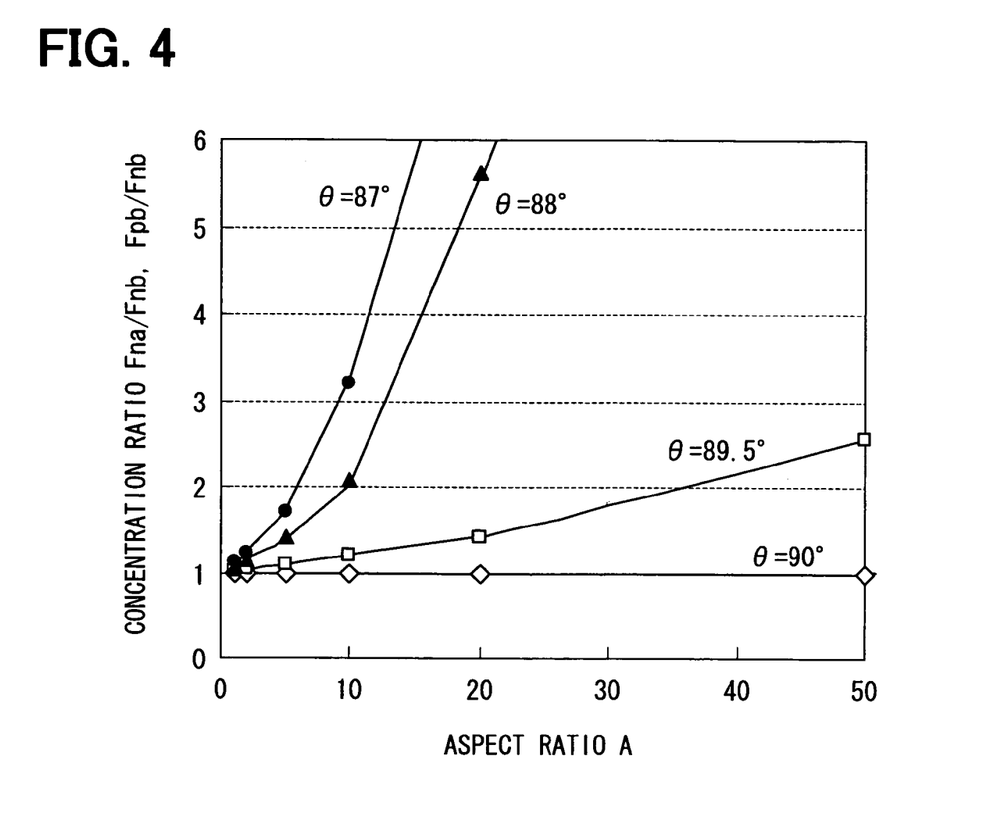
FIG. 4 is a graph illustrating calculated relations between impurity concentration ratios Fna/Fnb, Fpb/Fnb of columns of the P-N column layer 30s and aspect ratios of the columns of the P-N column layer 30s with using a taper angle of the columns of the P-N column layer 30s as parameter.

FIG. 4 is a graph illustrating representative relations between impurity concentration ratios Fna/Fnb, Fpb/Fnb and the aspect ratios A of the columns of the P-N column layer 30s with using the taper angle θ of the columns of the P-N column layer 30s as parameter, the relation being calculated with using the above-described equations (1) to (3).

As shown in FIG. 4, it may be preferable to configure the semiconductor device 110s shown in FIG. 3 such that a taper angle θ of the N conductivity type column 7ns is greater than or equal to 89.5 degree and less than 90.0 degree. In the above case, it may be easy to process a trench. When the semiconductor device is configured such that an aspect ratio A is nearly equal to 50 for instance, the concentration ratio becomes less than or equal to 3, which is sufficiently gentle variation of the impurity concentration. Therefore, in any depth, the impurity quantity of the N conductivity type column 7ns can approaches that of the P conductivity type column 7ps with high accuracy.

Figure 5A:
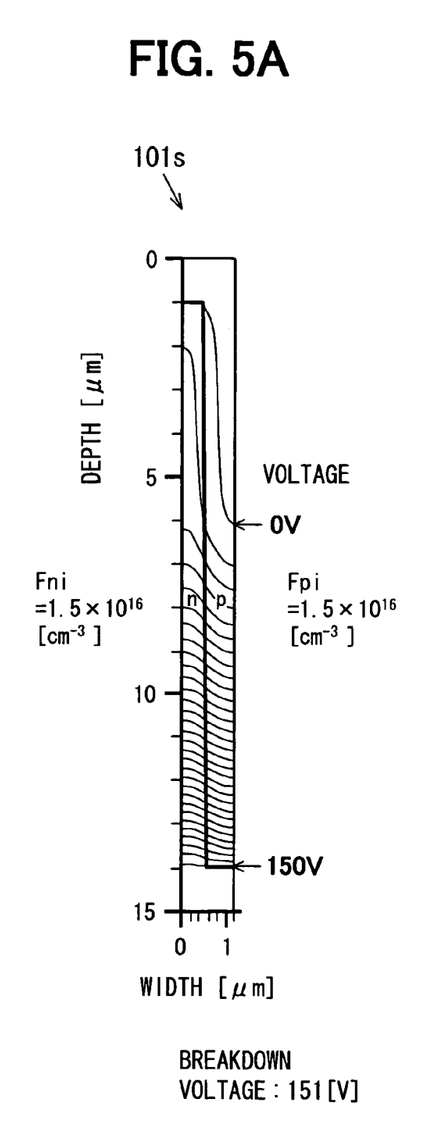
FIG. 5A is a graph illustrating a representative example of an electric potential distribution in a semiconductor device 101s for a case of a depletion layer formation, the electric potential distribution being obtained by numerical calculations.
Figure 5B:
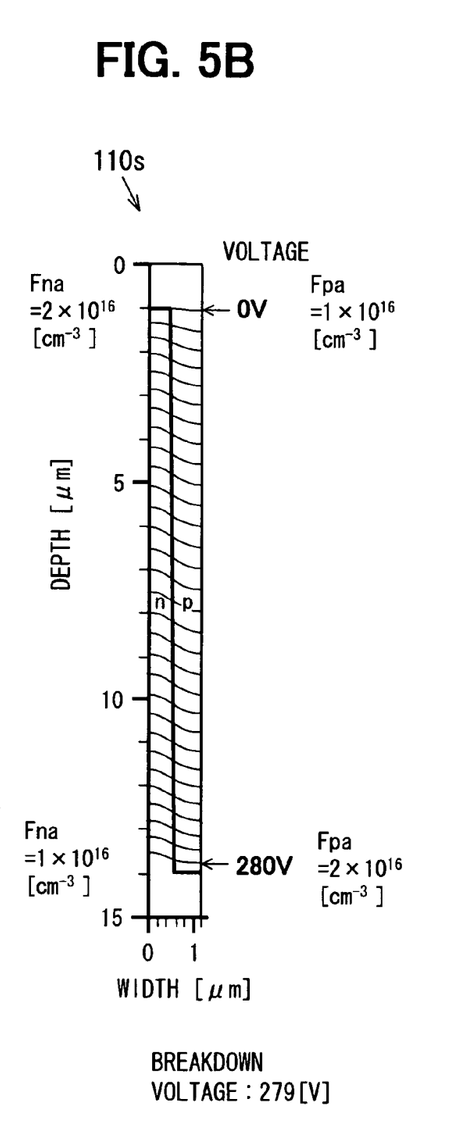
FIG. 5B is a graph illustrating a representative example of an electric potential distribution in a semiconductor device 110s for a case of a depletion layer formation, the electric potential distribution being obtained by numerical calculations.

FIGS. 5A and 5B illustrate representative example results of numerical simulations associated with a breakdown voltage. FIG. 5A shows an electric potential distribution in the P-N column layer of the semiconductor device 101s for a case of a depletion layer formation, where an impurity concentration is substantially constant in the P-N column layer of the semiconductor device 101s. FIG. 5B shows an electric potential distribution in the P-N column layer of the semiconductor device 110s for a case of a depletion layer formation.

The semiconductor devices 101s shown in FIG. 5A includes the P-N column layer having a taper angle of 89.5 degree and having a shape (e.g., a depth and a width) substantially identical to that shown in FIG. 2A. The semiconductor devices 110s shown in FIG. 5B includes the P-N column layer having a taper angle of 89.5 degree and having a shape (e.g., a depth and a width) substantially identical to that shown in FIG. 2B. In the semiconductor device 101s, each of the N conductivity type columns and the P conductivity type columns has a constant impurity concentration therein, which is set to $1.5 \times 10^{16}$ cm$^{-3}$. In the semiconductor devices 110s shown in FIG. 5B, the N conductivity type column has impurity concentrations such as to linearly decreases with depth from $2 \times 10^{16}$ cm$^{-3}$ to $1 \times 10^{16}$ cm$^{-3}$, and the P conductivity type column has an impurity concentration such as to linearly increase with depth from $1 \times 10^{16}$ cm$^{-3}$ to $2 \times 10^{16}$ cm$^{-3}$.

In the case of the semiconductor device 101s having the constant impurity concentration distribution, as shown in FIG. 5A, equi-potential lines are concentrated in a bottom region of the P-N column layer, and the breakdown voltage 151V is obtained. In the case of the semiconductor device 110S having the linearly-varying impurity concentration distribution, as shown in FIG. 5B, equi-potential lines are substantially uniformly-distributed with respect to depth in whole of the P-N column layer, and the breakdown voltage 279V is provided, which is roughly twice as large as that in the case of the semiconductor device 101s. As described above, each of the above semiconductor devices 110, 110s includes the P-N column layer 30, 30s, which functions as the super junction and which includes the P-N column layers having the column with a high aspect ratio. The semiconductor device 110, 110s has a high breakdown voltage.

A method for manufacturing a semiconductor device (SJ-MOS) 110 is described below with reference to FIGS. 6A to 7B.

FIGS. 6A to 6F are cross sectional views associated with processes in the method for manufacturing the SJ-MOS 110. In FIGS. 6A to 6F, high dot density in each of FIGS. 6A to 6F indicates a high impurity concentration and a low dot density indicates a low impurity concentration.

Figure 6A:
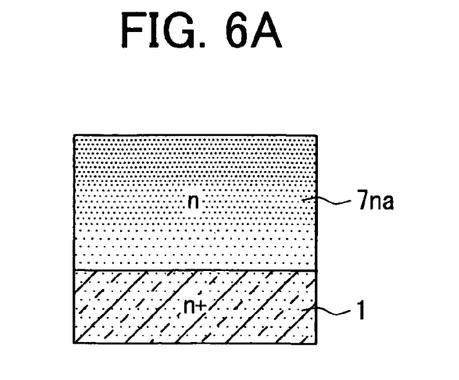
FIGS. 6A-6F are diagrams illustrating cross sectional views associated with processes in a method for manufacturing the semiconductor device 110 shown in FIG. 1.

At a process shown in FIG. 6A, an N conductivity type epitaxial layer 7na made of silicon is formed on a silicon substrate 1 having the N+ conductivity type, so that: a portion of the N conductivity type epitaxial layer 7na located around the substrate 1 has a small impurity concentration; and an impurity concentration in the N conductivity type epitaxial layer 7na increases with increasing distance from the silicon substrate 1. The N conductivity type epitaxial layer 7na having the above impurity concentration distribution is formed under a condition where, for instance, a flow rate of a dopant gas (e.g., phosphine $PH_3$) gradually increases during a formation of the N conductivity type epitaxial layer 7na.

Figure 6B:
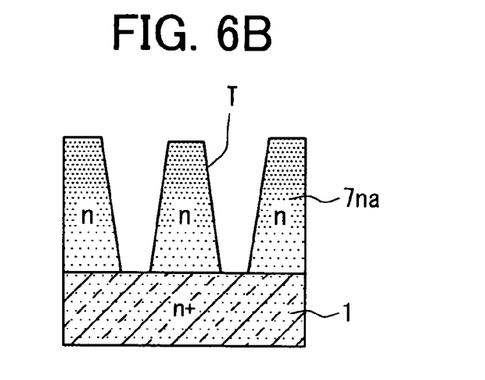

At a process shown in FIG. 6B, a plurality of trenches T is formed in the N conductivity type epitaxial layer 7na. As shown in FIG. 6B, each trench T is formed to have a substantially rectangular box shape. As shown in FIG. 6B, a cross sectional view of each trench T taken along a first plane parallel to the surface of the silicon substrate 1 has a substantially rectangular shape. The plurality of trenches is arranged at regular intervals. Each trench T has another cross section taken along the second plane. The another cross section taken along the second plane corresponds to the cross sectional view shown in FIG. 6B. The another cross section has a substantially tapered shape such that a distance between side walls located near the silicon substrate 1 is narrow and a distance between side walls of each trench T located distant from the silicon substrate 1 is wide.

An aspect ratio of each trench T shown in FIG. 6B is formed to be, for example, greater than or equal to 1 and less than or equal to 100, as described above. It may be preferable that the width of each trench T is, for example, greater than or equal to 0.1 μand less than or equal to 3 μm. When the adopted width of the trench T is greater than or equal to 0.1 μm, it may be possible to easily form the plurality of trenches T with high dimensional accuracy. When the columns in the finally-formed P-N column layer 30 are chosen to have a same thickness to ensure a high breakdown voltage, and when each trench T has a width less than or equal to 3 μm, each trench T is configured to have an high aspect ratio. It is therefore possible to form the trench filling epitaxial layer 7pa with a high growth rate by, for example, low pressure chemical vapor deposition (low pressure CVD), as described below. It may be preferable that a taper angle of each trench T is formed to be greater than or equal to 89.5 degree and less than 90.0 degree.

Figure 7A:
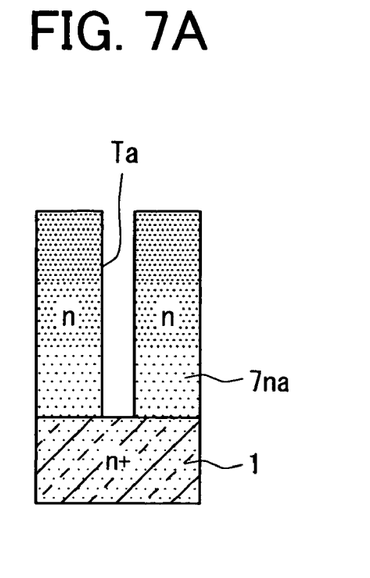
FIGS. 7A and 7B are diagrams illustrating cross sectional views associated with a two-step process of forming a plurality of trenches.
Figure 7B:
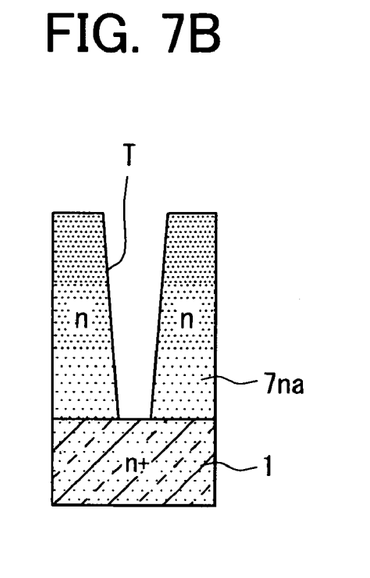

The plurality of trenches T is formed through one process as shown in FIG. 6B. Alternatively, the plurality of trenches T may be formed through two-step etching, as shown in FIGS. 7A and 7B. In FIGS. 7A and 7B, high dot density in each of FIGS. 7A and 7B indicates a high impurity concentration and a low dot density indicates a low impurity concentration.

More specifically, as shown in FIG. 7A, the plurality of trenches T may be formed by vertical etching the N conductivity type epitaxial layer 7na, so that: the plurality of trenches T is arranged at regular intervals; and each trench T has a cross section having a substantially rectangular shape, the cross section taken along the first plane, which is parallel to the surface of the substrate. Then, as shown in FIG. 7B, the plurality of trenches T may be shaped by etching with using hydrochloric gas (e.g., HCl). As a result, each trench T has a tapered shape such that a distance between the side-walls of each trench T positioned close to the silicon substrate 1 (i.e., a bottom of the trench T) is small and the distance between the side-walls of the trench T positioned distant from the silicon substrate 1 is large. A processing condition in the etching with the using hydrochloric gas includes, for example, the followings; temperatures are in a range between 900 degree C. and 1200 degree C.; and pressure is in a range between 40 Torr and 760 Torr. Under the above condition: a supply-limited reaction is dominant in the etching the N conductivity type epitaxial layer 7na; HCl gas supply is small for around the bottom of each trench T; and HCl gas supply is large for around an entrance of each trench T. Thus, an etching rate is higher around the entrance of the each trench T than around the bottom of each trench T. Consequently, each trench T is formed to have a forward tapered shape.

When each trench T is adopted to have a taper angle of approximately 90 degree, the above taper angle may be obtained with higher accuracy by employing the above two-step process than by the one process.

The plurality of trenches T shown in FIG. 6B or FIG. 7A may be formed by dry-etching. Alternatively, the plurality of trenches T shown in FIG. 6B or FIG. 7A may be formed by wet-etching. When the plurality of trenches is formed by wet-etching, the trenches may suffer less damage and manufacturing cost reduces.

Figure 6C:
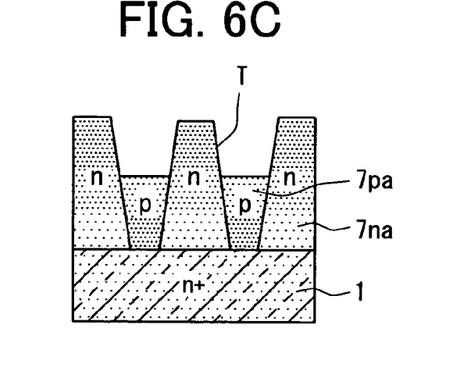
Figure 6D:
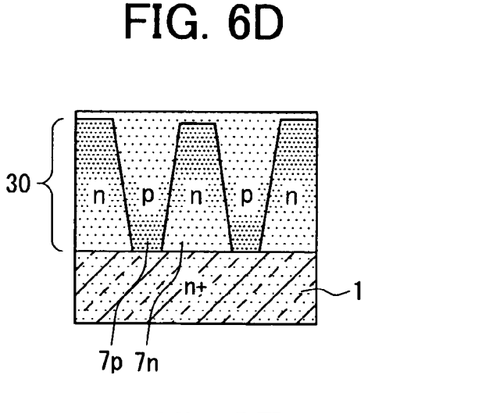

At a process shown in FIGS. 6C and 6D, the trench filling epitaxial layer 7pa having the P conductivity type is formed in each trench T. The trench filling epitaxial layer 7pa has such an impurity concentration distribution that a high impurity concentration is provided in a portion of the trench filling epitaxial layer 7pa positioned closed to the silicon substrate 1 and a low impurity concentration is provided in another portion of the trench filling epitaxial layer 7pa positioned closed to the entrance of each trench T. Through the above process, the plurality of trenches T is filled, as shown in FIG. 6D. The N conductivity type epitaxial layer 7na provides the multiple N conductivity type columns 7n. The multiple trench filling epitaxial layers 7pa provide the multiple P conductivity type columns 7p.

In the forming the trench filling epitaxial layer 7pa having the above impurity concentration distribution, if the epitaxial growth simultaneously proceeds at the bottom and the entrance of each trench T, it is difficult to vary the impurity concentration in the trench filling epitaxial layer 7pa with high dimensional accuracy with respect to depth. For the above reason, in the forming the trench filling epitaxial layer 7pa, it may be preferable that a growth rate is set to be large for a portion of the trench filling epitaxial layer 7pa located around the silicon substrate 1, and a growth rate is set to be small for another portion of the trench filling epitaxial layer 7pa located around the entrance of each trench T. In the above case, the trench filling epitaxial layer 7pa grows upward from the bottom of each trench T and it is possible to perform high-accuracy control of the impurity concentration distribution.

It may be preferable that the above epitaxial layer 7pa is formed by low pressure CVD. By the low pressure CVD, the trench filling epitaxial layer may grow at a higher growth rate than by physical absorption or the like according to another method for forming the epitaxial layer 7pa. In performing the low pressure CVD, it may be preferable that, with using simultaneous-flowing silicon source gas (e.g., dichlorosilane: SiH2Cl2) and a halide gas (e.g., hydrogen chloride: HCl), the trenches T are filled. According to the above, a growth rate of the portion of the trench filling epitaxial layer located around the bottom of each trench T is larger than that of the another portion of the trench filling epitaxial layer located around the entrance of each trench T. Therefore, the trench filling epitaxial layer 7pa may preferentially grow from the bottom of each trench T. It is possible to form the trench filling epitaxial layer 7pa with less crystal defects. As described above, when the width of each trench T is less than or equal to 3 μm, each trench T has a high aspect ratio. The high aspect ratio causes a large growth rate of the trench filling epitaxial layer 7pa. It is therefore possible to form, with high throughput, the P-N column layer 30 having a high arrangement density of the N conductivity type columns 7n and the P conductivity type columns 7p. The trench filling epitaxial layer 7pa with a film shape is formed while a flow rate of a dopant gas such as a diborane ($B_2H_6$) gas is gradually decreasing. It is possible to easily form the trench filling epitaxial layer 7pa having such an impurity concentration distribution with high accuracy that the impurity concentration of the portion of the trench filling epitaxial layer 7pa located around the silicon substrate 1 is larger than that of the another portion of the trench filling epitaxial layer 7pa located around the entrance of each trench T.

In the process shown in FIG. 7B of the forming the plurality of trenches T, and in the process shown in FIGS. 6C, 6D of the forming the trench filling epitaxial layer 7pa, an inner surface of the plurality of trenches T shown in FIG. 7B may be etched using etching gas in a low pressure chamber, and then, the trench filling epitaxial layer 7pa may be formed in the same low pressure chamber as that used in the etching. According to the above etching and the forming, the trench filling epitaxial layer 7pa is formed while a low pressure state is being maintained. It is therefore possible to form the P-N column layer 30 having less defects and a better electric property. In the above process, a sacrifice oxidation, a chemical dry etching, and heat treatment in low pressure hydrogen atmosphere may be performed between the process of the forming the plurality of trenches T shown in FIG. 6B and the process of the forming the trench filling epitaxial layer shown in FIG. 6C. Since the above additional processes can clean surfaces of the plurality of trenches T before the trench filling epitaxial layer 7pa is formed, it is possible to form the trench filling epitaxial layer 7pa with less defects.

Figure 6E:
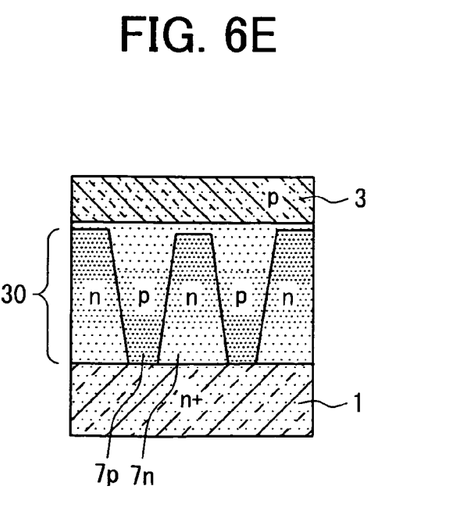

At a process shown in FIG. 6E, after the trench filling epitaxial layer 7pa is polished to flatten, the P conductivity type epitaxial layer 3 is formed on the P-N column layer 30 having the N conductivity type columns 7n and the P conductivity type columns 7p. The P conductivity type epitaxial layer 3 is provided by an epitaxial layer made of silicon and provides a channel formation layer.

Figure 6F:
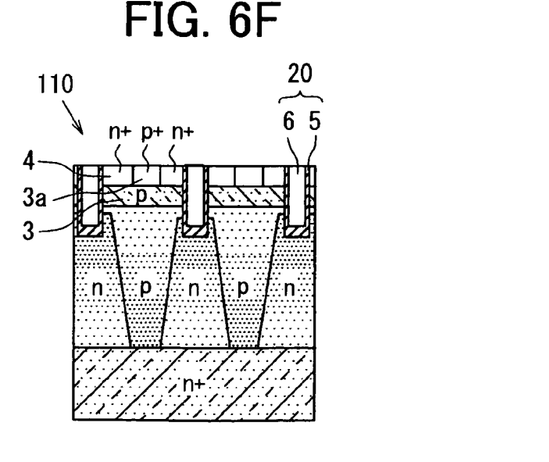

At a process shown in FIG. 6F, an N conductivity type region 4 and a P conductivity type region 3a are formed in a surface portion of the P conductivity type epitaxial layer 3. The N conductivity type region 4 provides a source region. The P conductivity type region having the P+ conductivity type can fix an electric potential of the P conductivity type epitaxial layer 3. Multiple trenches are formed so that each trench has a substantially rectangular box shape and penetrates through the P conductivity type epitaxial layer 3. Then, the trench insulation gate electrode 20 is formed in each trench by: forming the side wall insulation layer 5 on the inner walls of each trench; and filling each trench with the polycrystalline silicon 6.

The semiconductor device (SJ-MOS), shown in FIG. 1 for example, is manufactured through the above processes.

According to the manufacturing method including the processes shown in FIGS. 6A to 6F, the P-N column layer 30 is formed in such a manner that: the plurality of trenches T is formed in the N conductivity type epitaxial layer 7na formed on the silicon substrate 1; the multiple trench filling epitaxial layers 7pa are formed by filling the trenches T; the N conductivity type epitaxial layer 7na and the trench filling epitaxial layers 7pa provide the N conductivity type columns 7n and the P conductivity type columns 7p, respectively. According to the above method, it may be possible to form the P-N column layer 30 with a higher dimensional accuracy than that formed by, for example, the following method. Ions are selectively implanted in the N conductivity type epitaxial layer 7na, and then, implanted ions are thermally diffused. With using the method according to the present embodiment, it is possible to epitaxially grow the epitaxial layers having less voids, and in addition, it is possible to stably manufacture the P-N column layer 30 having the columns 7n, 7p with high aspect ratios and with less crystal defects. Further, with using the manufacturing method according to the present embodiment, it is possible to provide the semiconductor device (SJ-MOS) having a high breakdown voltage.

While the invention has been described with reference to preferred embodiments thereof, it is to be understood that the invention is not limited to the preferred embodiments and construction. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A semiconductor device comprising:
a substrate having a first conductivity type and having a first side;
a P-N column layer disposed on the first side of the substrate and provided by an epitaxial layer made of silicon; and
a second conductivity type epitaxial layer disposed on the P-N column layer and made of silicon, wherein:
the P-N column layer includes a plurality of first conductivity type columns and a plurality of second conductivity type columns, which are alternately arranged and in contact with each other;
each of the plurality of first and second conductivity type columns has a substantially rectangular box shape and a substantially same thickness along direction perpendicular to the first side of the substrate;
each first conductivity type column has a first cross section taken along a first plane parallel to the first side of the substrate, the first cross section having a substantially rectangular shape;
each second conductivity type column has a second cross section taken along the first plane, the second cross section having a substantially rectangular shape;
each first conductivity type column has a third cross section taken along a second plane, which is perpendicular to a contact surface between the first and second conductivity type columns and perpendicular to the first side of the substrate;
the third cross section of each first conductivity type column has a tapered shape such that a portion of the third cross section located around the substrate is wider than another portion of the third cross section located around the second conductivity type epitaxial layer;
the second conductivity type column has a fourth cross section taken along the second plane;
the fourth cross section of each second conductivity type column has a tapered shape such that a portion of the fourth cross section located around the substrate is narrower than another portion of the fourth cross section located around the second conductivity type epitaxial layer;
each first conductivity type column has a first impurity concentration distribution therein such that a portion of the first conductivity type column located around the substrate has a smaller impurity concentration than another portion of the first conductivity type column located around the second conductivity type epitaxial layer;
each second conductivity type column has a second impurity concentration distribution therein such that a portion of the second conductivity type column located around the substrate has a larger impurity concentration than another portion of the second conductivity type column located around the second conductivity type epitaxial layer;
the third cross section of each first conductivity type column has a substantially trapezoidal shape;
the fourth cross section of each second conductivity type column has a substantially trapezoidal shape;
the shape of the third cross section and the shape of the fourth cross section are substantially congruent;
an impurity quantity of each first conductivity type column is approximately equal to that of the adjacent second conductivity type column in almost any depth;
the depth is measured along a direction perpendicular to the first side of the substrate on the second plane;
the impurity quantity of each of the plurality of first and second conductivity type columns at a given depth is defined as an impurity concentration thereof at the given depth multiplied by a width thereof at the given depth; and
the width of each of the plurality of first and second conductivity type columns at a given depth is measured in a direction parallel to the first side of the substrate on the second plane.

2. The semiconductor device according to claim 1, wherein:
a sum of the impurity quantity of the first conductivity type column and that of the adjacent second conductivity type column is substantially constant with depth and is a predetermined value.

3. The semiconductor device according to claim 1, wherein:

the third cross section of the first conductivity type column has a taper angle, which is greater than or equal to 89.5 degree and which is less than 90 degree.

4. The semiconductor device according to claim 1, wherein
the third cross section of each first conductivity type column has an aspect ratio which is greater than 8, and
the fourth cross section of each second conductivity type column has an aspect ratio which is greater than 8.

5. The semiconductor device according to claim 4, wherein
the impurity concentration in each of the first and second conductivity type columns at any depth is greater than or equal to $10^{16}$ cm$^{-3}$.

6. The semiconductor device according to claim 5, wherein:
the third cross section of each first conductivity type column has an aspect ratio, which is less than or equal to 100; and
the fourth cross section of each second conductivity type column has an aspect ratio, which is less than or equal to 100.

7. A method for manufacturing a semiconductor device comprising:
forming a P-N column layer on a first side of silicon substrate having a first conductivity type, wherein the P-N column layer includes a plurality of a first conductivity type columns and a plurality of second conductivity type columns, which are alternately arranged and in contact with each other, wherein each of the plurality of first and second conductivity type columns has a substantially rectangular box shape and a substantially same thickness along a direction perpendicular to the first side of the substrate, and wherein the forming the P-N column layer includes:
forming a first conductivity type epitaxial layer made of silicon on the first side of the substrate so that a first portion of the first conductivity type epitaxial layer has a larger impurity concentration than a second portion of the first conductivity type epitaxial layer, wherein the first portion of the first conductivity type epitaxial layer is located more distant from the first side of the substrate than the second portion of the first conductivity type epitaxial layer;
forming a plurality of first trenches in the first conductivity type epitaxial layer, wherein each first trench has a substantially rectangular box shape, wherein the plurality of first trenches is arranged at regular intervals, wherein each first trench has a first cross section taken along a first plane parallel to the first side of the substrate and a second cross section taken along a second plane perpendicular to the first side of the substrate, wherein the first cross section of each first trench has a substantially rectangular shape, and wherein the second cross section of each first trench has a tapered shape such that a portion of the second cross section located close to the first side of the substrate is narrower than another portion of the second cross section located distant from the first side of the substrate; and
forming a plurality of trench filling epitaxial layers to fill the plurality of first trenches, wherein each trench filling epitaxial layer has a second conductivity type, wherein each trench filling epitaxial layer in each first trench has an impurity concentration distribution therein such that a first portion of the trench filling epitaxial layer has a larger impurity concentration than a second portion of the trench filling epitaxial layer, wherein the first portion of the trench filling epitaxial layer is located closer to the first side of the substrate than the second portion of the trench filling epitaxial layer, wherein the first conductivity type epitaxial layer provides the plurality of first conductivity type epitaxial columns, and wherein the plurality of trench filling epitaxial layers provides the plurality of second conductivity type columns; and
forming a second conductivity type epitaxial layer made of silicon on the P-N column layer, wherein
forming the plurality of trench filling epitaxial layers includes:
setting a growth rate of the first portion of each trench filling epitaxial layer larger than that of the second portion of the trench filling epitaxial layer, and
gradually decreasing a flow rate of dopant gas for impurities in the trench filling epitaxial layer, thereby providing the impurity concentration distribution to the trench filling epitaxial layer.

8. The method according to claim 7, wherein
the plurality of trench filling epitaxial layers is formed by low pressure chemical vapor deposition.

9. The method according to claim 8, wherein
the forming the plurality of trench filling epitaxial layers is formed by low pressure chemical vapor deposition with a silicon source gas and a halide gas simultaneously flowing.

10. The method according to claim 7, wherein
the distance between side-walls of each first trench is greater than or equal to 0.1 μm and less than or equal to 3 μm.

11. The method according to claim 7, wherein
a taper angle of each first trench is greater than or equal to 89.5 degree and less than 90 degree.

12. The method according to claim 7, further comprising:
etching an inner surface of each first trench with using an etching gas in a low pressure chamber before the forming the trench filling epitaxial layer, wherein the trench filling epitaxial layer is formed in the same low pressure chamber as used in the etching the inner surface of each first trench.

13. The method according to claim 7, further comprising:
performing a sacrifice oxidation, a chemical dry etching, and a heat treatment in low pressure hydrogen atmosphere to clean a surface of the plurality of first trenches, wherein
the sacrifice oxidation, the chemical dry etching and the heat treatment are performed between the forming the plurality of first trenches and the forming the plurality of trench filling epitaxial layers.

14. The method according to claim 7, wherein
the plurality of first trenches is formed by wet-etching.

15. The method according to claims 7, wherein:
the first conductivity type epitaxial layer and the plurality of trench filling epitaxial layers are formed so that an impurity quantity of each first conductivity type column is approximately equal to that of the adjacent second conductivity type column in almost any depth;
the depth is measured along a direction perpendicular to the first side of the substrate on the second plane;
the impurity quantity of each of the plurality of first and second conductivity type columns at a given depth is defined as an impurity concentration thereof at the given depth multiplied by a width of thereof at the given depth; and the width of each of the plurality of first and second conductivity type columns at a given depth is measured in a direction parallel to the first side of the substrate on the second plane.

16. The method of claim 7, wherein:
an impurity quantity of each first conductivity type column is approximately equal to that of the adjacent second conductivity type column in almost any depth;
the depth is measured along a direction perpendicular to the first side of the substrate on the second plane;
the impurity quantity of each of the plurality of first and second conductivity type columns at a given depth is defined as an impurity concentration thereof at the given depth multiplied by a width thereof at the given depth; and
the width of each of the plurality of first and second conductivity type columns at a given depth is measured in a direction parallel to the first side of the substrate on the second plane.

17. The method of claim 7, wherein
the forming the first conductivity type epitaxial layer includes:
gradually increasing, during formation of the first conductivity type epitaxial layer, a flow rate of dopant gas for impurities in the first conductivity type epitaxial layer.

18. The method of claim 7, wherein
the forming the plurality of first trenches is a two-step process including:
vertical etching the first conductivity type epitaxial layer so that the plurality of first trenches is arranged at regular intervals and each first trench has a cross section taken along the first plane, the cross section having a substantially rectangular shape; and
etching the plurality of first trenches so that each first trench has a tapered shape such that a portion of each first trench located close to the first side of the substrate is narrower than another portion of each first trench located distant from the first side of the substrate.

19. The method of claim 7, wherein
forming the plurality of first trenches includes forming each first trench such that each second cross section has an aspect ratio of greater than 8.

20. The method of claim 19, wherein
forming the first conductivity type epitaxial layer includes forming both the first portion of the first conductivity type epitaxial layer and the second portion of the first conductivity type epitaxial layer with an impurity concentration greater than or equal to $10^{16}$ cm$^{-3}$, and
forming the plurality of trench filling epitaxial layers includes forming both the first portion of each trench filling epitaxial layer and the second portion of each trench filling epitaxial layer with an impurity concentration greater than or equal to $10^{16}$ cm$^{-3}$.

21. The method according to claim 20, wherein
forming the plurality of first trenches includes forming each first trench such that each second cross section has an aspect ratio less than or equal to 100.

22. A method of manufacturing a semiconductor device comprising:
forming a P-N column layer on a first side of silicon substrate having a first conductivity type, wherein the P-N column layer includes a plurality of a first conductivity type columns and a plurality of second conductivity type columns, which are alternately arranged and in contact with each other, wherein each of the plurality of first and second conductivity type columns has a substantially rectangular box shape and a substantially same thickness along a direction perpendicular to the first side of the substrate, and wherein the forming the P-N column layer includes:
forming a first conductivity type epitaxial layer made of silicon on the first side of the substrate so that a first portion of the first conductivity type epitaxial layer has a larger impurity concentration than a second portion of the first conductivity type epitaxial layer, wherein the first portion of the first conductivity type epitaxial layer is located more distant from the first side of the substrate than the second portion of the first conductivity type epitaxial layer;
forming a plurality of first trenches in the first conductivity type epitaxial layer, wherein each first trench has a substantially rectangular box shape, wherein the plurality of first trenches is arranged at regular intervals, wherein each first trench has a first cross section taken along a first plane parallel to the first side of the substrate and a second cross section taken along a second plane perpendicular to the first side of the substrate, wherein the first cross section of each first trench has a substantially rectangular shape, and wherein the second cross section of each first trench has a tapered shape such that a portion of the second cross section located close to the first side of the substrate is narrower than another portion of the second cross section located distant from the first side of the substrate; and
forming a plurality of trench filling epitaxial layers to fill the plurality of first trenches, wherein each trench filling epitaxial layer has a second conductivity type, wherein each trench filling epitaxial layer in each first trench has an impurity concentration distribution therein such that a first portion of the trench filling epitaxial layer has a larger impurity concentration than a second portion of the trench filling epitaxial layer, wherein the first portion of the trench filling epitaxial layer is located closer to the first side of the substrate than the second portion of the trench filling epitaxial layer, wherein the first conductivity type epitaxial layer provides the plurality of first conductivity type epitaxial columns, and wherein the plurality of trench filling epitaxial layers provides the plurality of second conductivity type columns; and
forming a second conductivity type epitaxial layer made of silicon on the P-N column layer, wherein
the forming the plurality of first trenches is a two-step process including:
vertical etching the first conductivity type epitaxial layer so that the plurality of first trenches is arranged at regular intervals and each first trench has a cross section taken along the first plane, the cross section having a substantially rectangular shape; and
using hydrochloric gas, etching the plurality of first trenches so that each first trench has a tapered shape such that a portion of each first trench located close to the first side of the substrate is narrower than another portion of each first trench located distant from the first side of the substrate.

* * * * *